(12) United States Patent
Chung et al.

(10) Patent No.: US 8,466,462 B2
(45) Date of Patent: Jun. 18, 2013

(54) THIN FILM TRANSISTOR AND METHOD OF FABRICATING THE SAME

(75) Inventors: Hyun-Joong Chung, Suwon-si (KR); Min-Kyu Kim, Suwon-si (KR); Jong-Han Jeong, Suwon-si (KR); Yeon-Gon Mo, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 12/369,051

(22) Filed: Feb. 11, 2009

(65) Prior Publication Data

US 2010/0044699 A1 Feb. 25, 2010

(30) Foreign Application Priority Data

Aug. 21, 2008 (KR) .................. 10-2008-0081772

(51) Int. Cl.
*H01L 29/10* (2006.01)
(52) U.S. Cl.
USPC .............. 257/43; 257/79; 257/E29.296
(58) Field of Classification Search
CPC .................................................. H01L 29/7869
USPC .............. 257/43, 49, 52, 59, 40, 103, 289, 257/66, 79, E51.005, E29.151, E27.1, E29.117, 257/E29.137, E29.182, E29.202, E33.004, 257/E31.034, E31.047, E31.051, E21.411, 257/72, E29.296; 438/104
See application file for complete search history.

(56) References Cited

U.S. PATENT DOCUMENTS

| 6,570,197 | B2 * | 5/2003 | Joo ............................... 257/222 |
| 7,242,039 | B2 * | 7/2007 | Hoffman et al. .............. 257/213 |
| 7,541,229 | B2 * | 6/2009 | Gan et al. ...................... 438/158 |
| 2002/0024097 | A1 * | 2/2002 | Joo ............................... 257/359 |
| 2002/0146871 | A1 | 10/2002 | Watanabe et al. |
| 2004/0251474 | A1 * | 12/2004 | Uchida et al. ................. 257/202 |
| 2006/0244107 | A1 * | 11/2006 | Sugihara et al. .............. 257/646 |
| 2006/0275994 | A1 * | 12/2006 | Ando et al. .................... 438/386 |
| 2006/0286725 | A1 | 12/2006 | Cheng et al. |
| 2007/0026585 | A1 * | 2/2007 | Wong et al. ................... 438/151 |
| 2007/0029614 | A1 | 2/2007 | Shiota et al. |
| 2007/0194379 | A1 * | 8/2007 | Hosono et al. ................ 257/347 |
| 2008/0121884 | A1 * | 5/2008 | Wong et al. .................... 257/57 |
| 2008/0299702 | A1 * | 12/2008 | Son et al. ....................... 438/104 |
| 2010/0176837 | A1 * | 7/2010 | Kummel et al. .............. 324/765 |

FOREIGN PATENT DOCUMENTS

| CN | 1881549 | 12/2006 |
| CN | 1909249 | 2/2007 |
| EP | 0303252 | 2/1989 |

(Continued)

OTHER PUBLICATIONS

European Office Action dated Jan. 15, 2010, issued in corresponding European Patent Application No. 09252033.7.

(Continued)

*Primary Examiner* — Cuong Q Nguyen
*Assistant Examiner* — Yosef Gebreyesus
(74) *Attorney, Agent, or Firm* — H.C. Park & Associates, PLC (57) ABSTRACT

A thin film transistor (TFT) including a gate electrode, an active layer, and source and drain electrodes. The active layer includes contact regions that contact the source and drain electrodes, which are thinner than a remaining region of the active layer. The contact regions reduce the contact resistance between the active material layer and the source and drain electrodes.

8 Claims, 6 Drawing Sheets

FOREIGN PATENT DOCUMENTS

| | | |
|---|---|---|
| JP | 64-53462 | 3/1989 |
| JP | 6-232158 | 8/1994 |
| JP | 2002-368229 | 12/2002 |
| JP | 2008-166669 | 7/2008 |
| KR | 10-261268 | 4/2000 |
| KR | 2006-28158 | 3/2006 |
| KR | 10-2007-0031090 | 3/2007 |
| KR | 10-2007-0035373 | 3/2007 |
| KR | 10-0838752 | 6/2008 |
| WO | WO 2007029584 A1 * | 3/2007 |
| WO | WO 2007/089048 | 8/2007 |

OTHER PUBLICATIONS

Korean Office Action dated Mar. 8, 2010, issued in corresponding Korean Patent Application No. 10-2008-0081772.
Korean Patent Abstract, Publication No. 1020070016961.
Chinese Office Action dated Aug. 4, 2010, issued in corresponding Chinese Patent Application No. 200910136929.6.

* cited by examiner

THIN FILM TRANSISTOR AND METHOD OF FABRICATING THE SAME

CROSS-REFERENCE TO RELATED APPLICATIONS

This application claims the benefit of Korean Patent Application No. 2008-81772, filed on Aug. 21, 2008, in the Korean Intellectual Property Office, the disclosure of which is incorporated herein, by reference.

BACKGROUND OF THE INVENTION

1. Field of the Invention

Aspects of the present invention relate to a thin film transistor and a method of fabricating the same.

2. Description of the Related Art

Currently, thin film transistors (TFT) are widely used as switching devices and driving circuits, which control the operation of pixels in a display device, such as an organic light emitting display (OLED) or a liquid crystal display (LCD). Therefore, research into improving the characteristics of TFTs is currently being conducted.

Contact resistance, which is generated by contact between an active layer and source and drain electrodes of a TFT, can degrade the performance of a TFT. High contact resistance can reduce the power generated by a charge injecting unit of a TFT.

SUMMARY OF THE INVENTION

Aspects of the present invention provide a thin film transistor (TFT) having reduced contact resistance between electrodes and an active layer, and a method of fabricating the same.

According to aspects the present invention, there is provided a thin film transistor (TFT) including a gate electrode, an active layer, and source and drain electrodes. The active layer includes contact regions that contact the source and drain electrodes, and a remaining region that excludes the contact regions. The contact regions are thinner than the remaining region.

According to aspects the present invention, the thickness of the contact regions can be from 10% to 90% of the thickness of the remaining region.

According to aspects the present invention, the active layer can include an oxide semiconductor.

According to aspects the present invention, the TFT can have a bottom gate structure. The source and drain electrodes can directly contact the contact region of the active layer.

According to aspects the present invention, the TFT can further include an etch stop layer formed on the remaining region of the active layer.

According to aspects the present invention, the TFT can further include an interface stabilizing layer formed under the active layer. The interface stabilizing layer can include an oxide having a band gap equal to, or larger than, the band gap of the active layer.

According to aspects the present invention, there is provided a method of fabricating a TFT, the method including forming a gate electrode on a substrate, forming a gate insulating layer on the gate electrode, forming an active layer on the gate insulating layer, and forming source and drain electrodes on contact regions of the active layer. The contact regions are formed by patterning the active layer, such that the contact regions are thinner than a remaining region of the active layer.

According to aspects the present invention, the forming of the active layer can include forming an oxide semiconductor layer on the gate insulating layer and patterning the oxide semiconductor using a half-tone mask, to form the active layer having the contact regions.

According to aspects the present invention, an etch stop layer can be formed on the remaining region of the active layer, prior to forming the source and drain electrodes. The active layer can be initially formed to a uniform thickness, and the patterning of the etch stop layer can include an over etching process, which forms the contact regions.

According to aspects the present invention, the method can further include forming an interface stabilizing layer on the gate insulating layer, and then forming the active layer thereon. The interface stabilizing layer can include an oxide having a band gap equal to, or larger than, the band gap of the active layer.

According to aspects the present invention, the contact regions have a smaller thickness than the remaining region. Therefore, the contact resistance between the source and drain electrodes and the active layer is reduced, resulting in a TFT having improved performance.

According to aspects the present invention, the active layer includes an oxide semiconductor, which improves the characteristics of the TFT.

Additional aspects and/or advantages of the present invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

In the following detailed description, only certain exemplary embodiments of the present invention have been shown and described, by way of illustration. As those skilled in the art would realize, the described exemplary embodiments may be modified in various different ways, all without departing from the spirit or scope of the present invention. Accordingly, the drawings and description are to be regarded as illustrative in nature and not restrictive. In addition, when an element is referred to as being disposed "on" another element, it can be disposed directly on the other element, or one or more intervening elements interposed therebetween. When an element is referred to as being "connected to" another element, it can be directly connected to the other element, or can be indirectly connected to the other element, with one or more intervening elements interposed therebetween. Herein, like reference numerals refer to like elements throughout. The exemplary embodiments of the present invention will be described as follows, with reference to the accompanying drawings.

Figure 1:
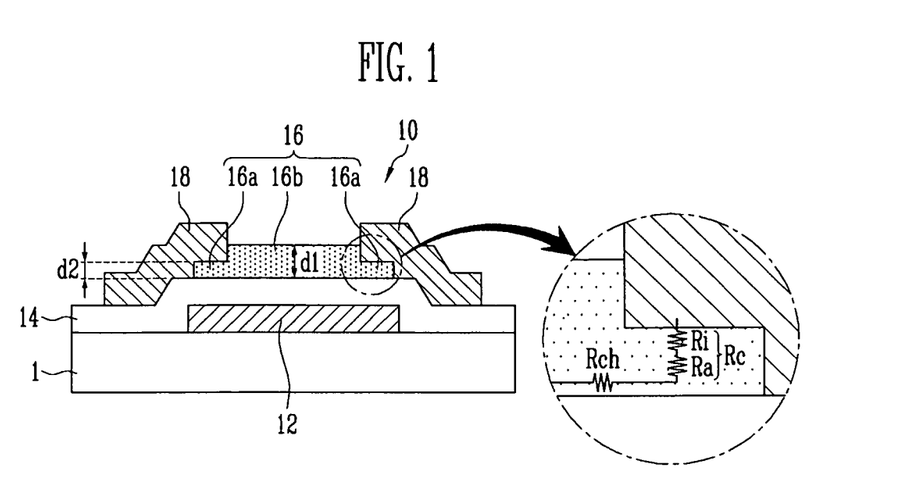
FIG. 1 is a cross-sectional view illustrating a thin film transistor (TFT), according to an exemplary embodiment of the present invention.

FIG. 1 is a cross-sectional view illustrating a thin film transistor (TFT) 10, according to an exemplary embodiment of the present invention. Referring to FIG. 1, the TFT 10 has a bottom gate structure (an inverse staggered structure) and includes a substrate 1, a gate electrode 12 formed on the substrate 1, a gate insulating layer 14 formed on the gate electrode 12 and the substrate 1, an active layer 16 formed on the gate insulating layer 14 and disposed over the gate electrode 12, and source and drain electrodes 18 formed on contact regions 16a of the active layer 16.

The active layer 16 can include an oxide semiconductor, for example, an amorphous oxide having electron carriers with a density of less than $1018/cm^3$. The active layer 16 can reduce the leakage current of the TFT 10, improve the switching characteristics (increase the on-off ratio), and improve the saturation current and switching speed in a pinch-off state. The active layer 16 can be disposed so as to overlap the gate electrode 12.

The amorphous oxide can include indium (In), zinc (Zn), and tin (Sn); In, Zn, and gallium (Ga), or a combination thereof. As an example, the active layer 16 can include In—Ga—Zn—O (IGZO), which can be represented as $InGaO_3(ZnO)_m$ (m is a natural number less than 6) in a crystalline state. As another example, the active layer 16 can include In—Ga—Zn—Mg—O (IGZMO), which can be represented as $InGaO_3(Zn1-XMg_xO)_m$ (0<X≦1 and m is a natural number less than 6) containing an electron carrier having a density of less than $1×1018/cm^3$. In addition, the active layer 16 can include an amorphous oxide containing at least one of Li, Na, Mn, Ni, Pd, Cu, Cd, C, N, P, Ti, Zr, Hf, V, Ru, Ge, Sn, and F.

In the active layer 16, the thickness d2 of the contact portions 16a is less than the thickness d1 of the remaining region 16b. Therefore, the contact resistance between the active layer 16 and the source and drain electrodes 18 is reduced. The remaining region 16b refers to all areas of the active layer 16, except for the contact portions 16a. The source and drain electrodes 18 can be disposed so as to contact the contact regions.

As illustrated in the following EQUATION 1, the total resistance $R_T$ of the active layer 16 is the sum of the channel resistance $R_{Ch}$ generated by a channel unit and the contact resistance $R_C$ generated by the contact between the active layer 16 and the source and drain electrodes 18.

$$R_T = R_{Ch} + R_C \text{ (units are all [Ohm])} \quad [\text{EQUATION 1}]$$

Here, the contact resistance $R_C$ should ideally be 0. However, in actuality the contact resistance $R_C$ is a parasitic resistance between the active layer 16 and the source and drain electrodes 18. The contact resistance $R_C$ is the sum of an injection resistance Ri and an access resistance Ra.

The injection resistance Ri is related to the material characteristics of the active layer 16 and the source and drain electrodes 18. The access resistance Ra is related to the thickness d2 of the contact regions 16a.

Therefore, according to aspects of the present invention, the thickness d2 of the contact regions 16a is reduced, to decrease the contact resistance $R_C$ and improve the performance of the TFT 10. For example, the thickness d2 of the regions 16a can be 10% to 90% of the thickness d1 of the remaining region 16b. This is because it is may be difficult to pattern the active layer, such that the thickness d2 is less than 10% of the thickness d1. If the thickness d2 of the contact regions 16a is greater than 90% of the thickness d1 of the remaining region 16b, the contact resistance $R_C$ may not be significantly reduced.

As described above, according to aspects of the present invention, the characteristics of the TFT 10 are improved, because the active layer 16 is formed of the oxide semiconductor, as compared with a TFT having an amorphous silicon (a-Si), or a polysilicon (poly-Si), active layer. In addition, the TFT 10 does not require an additional crystallizing process to crystallize the active layer 16, which is the case when using a low temperature polysilicon (LTPS) active layer. The active material layer 16 can be formed by sputtering and can be easily enlarged using current equipment.

The thickness d2 of the contact regions 16a is smaller than the thickness d1 of the remaining region 16b, which reduces the contact resistance $R_C$ and improves the performance of the TFT 10. Furthermore, since the thickness d2 is locally reduced, it is possible to stably form the TFT 10.

In the present exemplary embodiment, the active layer 16 includes the oxide semiconductor. However, the present invention is not so limited. For example, the active layer 16 can be formed of amorphous silicon (a-Si) or polysilicon (poly-Si). In such a case, it is possible to reduce the contact resistance $R_C$, by locally reducing the thickness d2 of the contact regions 16a.

Figure 2A:
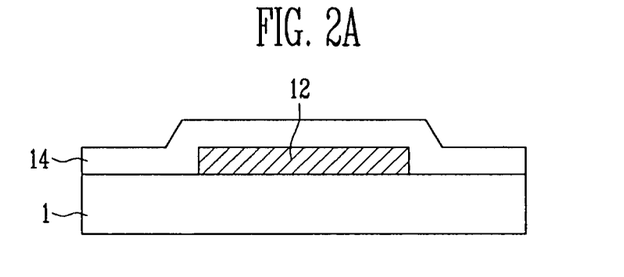
FIGS. 2A to 2C are cross-sectional views sequentially illustrating a method of fabricating the TFT of FIG. 1.
Figure 2B:
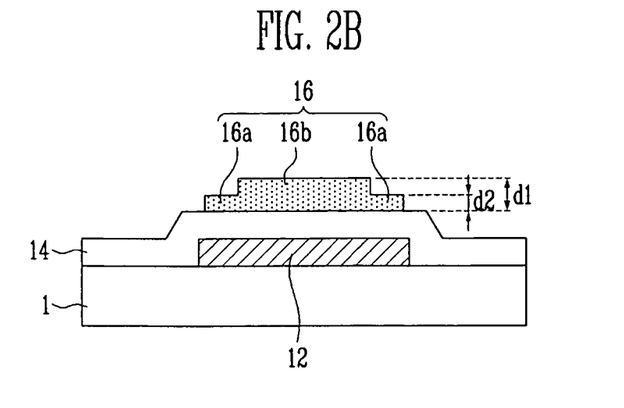
Figure 2C:
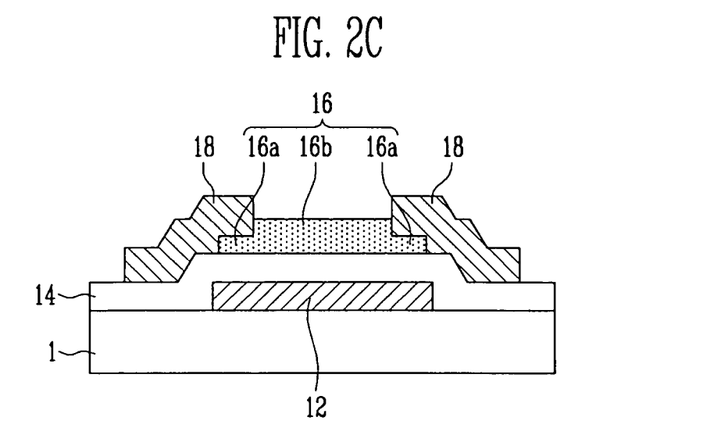

FIGS. 2A to 2C are cross-sectional views sequentially illustrating a method of fabricating the TFT 10 of FIG. 1. In the method, the gate electrode 12 and the gate insulating layer 14 are sequentially formed on the substrate 1 (FIG. 2A).

Then, an oxide semiconductor layer is formed on the gate insulating layer 14 and then patterned to form the active layer 16. The active layer 16 is formed using a half-tone mask, so that the thickness d2 of the contact regions 16a is reduced, with respect to the thickness d1 of the remaining region 16b. For example, the thickness d2 can be from about 10% to 90% of the thickness d1 (FIG. 2B).

Then, the source and drain electrodes 18 are formed on the contact regions 16a (FIG. 2C). By performing the above processes, the thickness of the contact regions 16a can be locally reduced.

Figure 3:
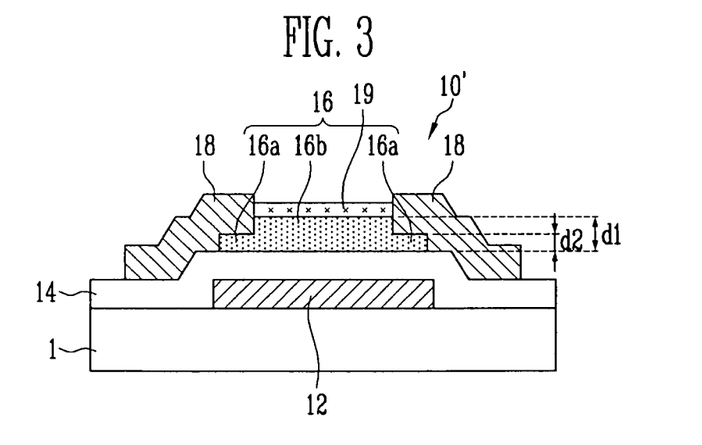
FIG. 3 is a cross-sectional view illustrating a TFT, according to another exemplary embodiment of the present invention.

FIG. 3 is a cross-sectional view illustrating a TFT 10', according to another exemplary embodiment of the present invention. Elements similar to the elements of FIG. 2 have the same reference numerals, and a detailed description thereof is omitted. Referring to FIG. 3, the TFT 10' includes an etch stop layer 19 formed on a remaining region 16b of an active layer 16, but is not formed on contact regions 16a thereof, which contact source and drain electrodes 18. The etch stop layer 19 can be formed of various insulating materials and can be a passivation layer that protects the active layer 16.

Figure 4A:
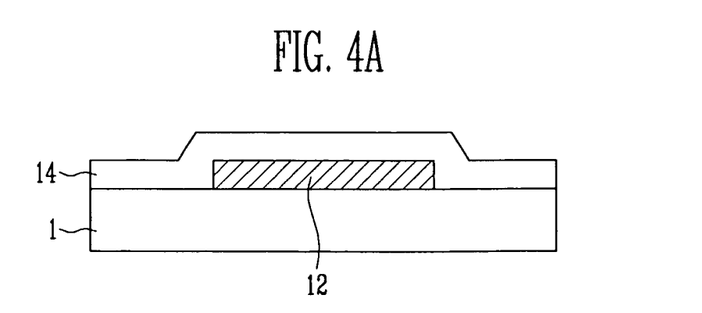
FIGS. 4A to 4E are cross-sectional views sequentially illustrating a method of fabricating the TFT of FIG. 3.

FIGS. 4A to 4E are cross-sectional views sequentially illustrating a method of fabricating the TFT 10' of FIG. 3. In the method, a gate electrode 12 and a gate insulating layer 14 are sequentially formed on a substrate 1 (FIG. 4A).

Figure 4B:
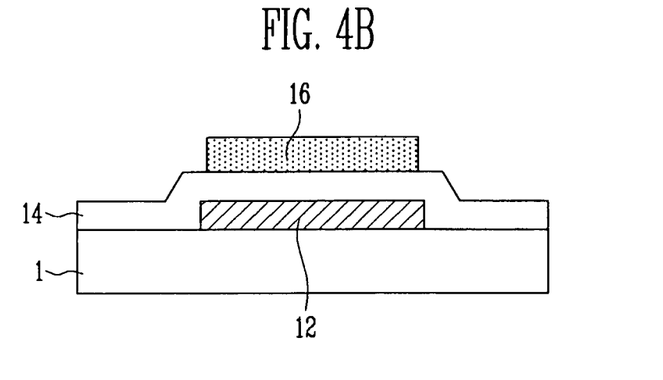
Figure 4C:
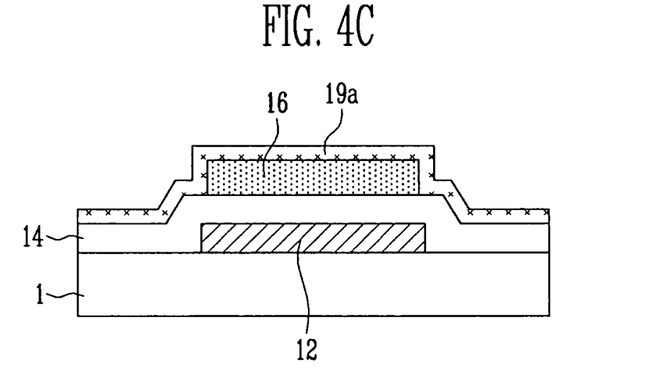

Then, an active material layer 16, which is formed of an oxide semiconductor, is formed on the gate insulating layer 14. The active material layer 16 can initially have a uniform thickness (FIG. 4B). Then, an etch stop material 19a is formed on the active layer 16, in order to protect the active layer 16 from damage during subsequent processes (FIG. 4C).

Figure 4D:
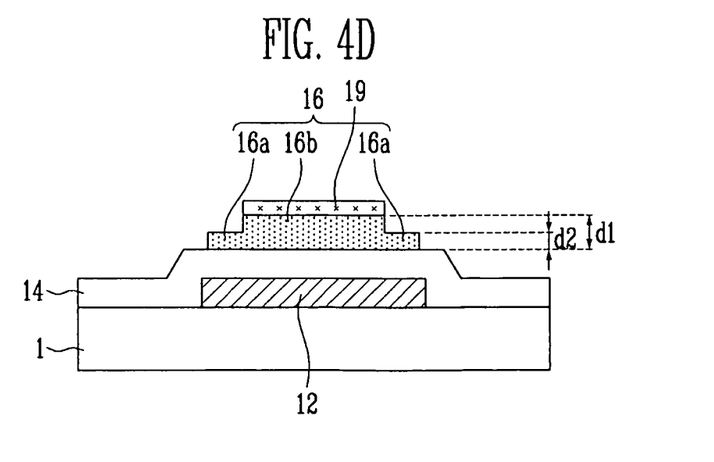

Then, the etch stop layer 19 is etched using a patterning process, to expose contact regions 16a, but is not removed from a remaining region 16b. After the etch stop layer 19 is patterned, an over-etching process is performed, such as dry etching or wet etching, using an etching solution with a small selection ratio. The over-etching reduces the thickness of the contact regions 16a. For example, the over-etching can be performed so that the thickness d2 of the contact regions 16a is from about 10% to 90% of the thickness d1 of the remaining region 16b. Therefore, the patterning results in the active layer 16 having a stepped structure (FIG. 4D).

Figure 4E:
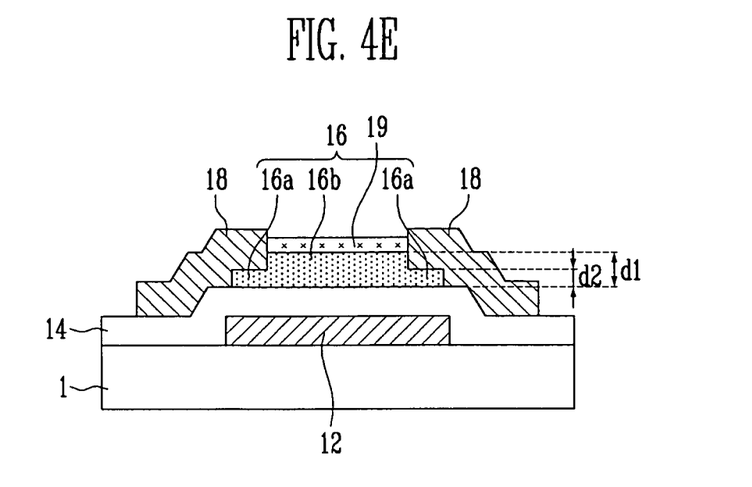

Then, the source and drain electrodes 18 are formed on the contact regions 16a (FIG. 4E). By performing the above processes the thickness of the active layer 16 can be locally reduced in the contact regions 16a.

Figure 5A:
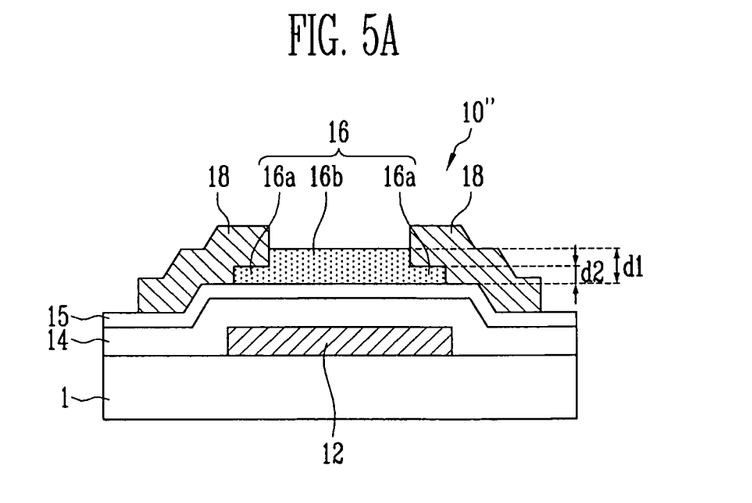
FIGS. 5A and 5B are cross-sectional views illustrating TFTs, according to still other exemplary embodiments of the present invention.
Figure 5B:
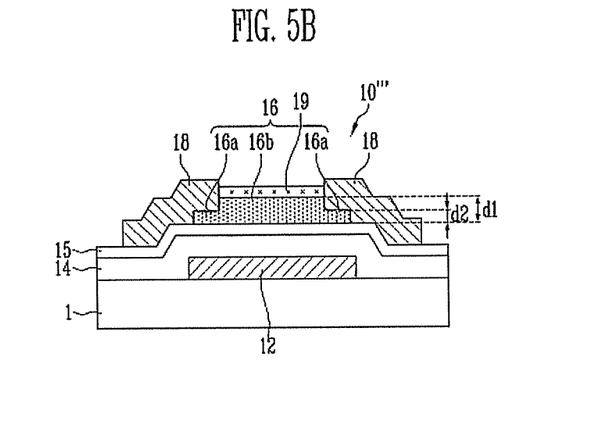

FIGS. 5A and 5B are cross-sectional views illustrating TFTs 10" and 10'", according to exemplary embodiments of the present invention. Elements similar to previously described elements have the same reference numbers and are not described in detail. Referring to FIGS. 5A and 5B, TFTs 10" and 10'" include an interface stabilizing layer 15 disposed under an active layer 16.

The interface stabilizing layer 15 includes an oxide having a band gap equal to, or greater than, the band gap of the active layer 16. For example, the band gap can be from about 3.0 eV to 8.0 eV. The oxide can be selected from the group consisting of $SiO_x$, SiN, $SiO_xN_y$, $SiO_xC_y$, $SiO_xC_yH_z$, $SiO_xF_y$, $GeO_x$, $GdO_x$, $AlO_x$, $GaO_c$, SbO, $ZrO_x$, $HfO_x$, $TaO_x$, $YO_x$, $VO_x$, $MgO_x$, $CaO_x$, $BaO_x$, $SrO_x$, and SOG (spun on glass).

When the band gap of the interface stabilizing layer 15 is less than about 3.0 eV, charge can easily escape, and the carrier of a channel may not be effectively used. When the band gap is larger than 8.0 eV, electrical characteristics may be reduced, due to highly insulating characteristics.

Since the interface stabilizing layer 15 is flush with the gate insulating layer 14, a high stability interface is formed. Since the interface stabilizing layer 15 has a band gap equal to, or greater than that of the active layer 16, charge trapping is suppressed.

In order to improve the charge trapping suppression, the hydrogen density of the interface stabilizing layer 15 can be $10^{+19}/cm^3$, or less. When the hydrogen density of the interface stabilizing layer 15 is greater than $10^{+19}/cm^3$, hydrogen can diffuse into the surface of the active layer 16 and may operate as a trap, thereby reducing the electrical characteristics of the active layer 16. In order to control the hydrogen density of the interface stabilizing layer 15, a physical deposition method such as sputtering can be used, rather than a chemical deposition method.

The interface stabilizing layer 15 can entirely cover the gate insulating layer 14, as illustrated in FIGS. 5A and 5B, or can be patterned to correspond to only the active layer 16. For example, when the interface stabilizing layer 15 is formed of a conductive material, it can be patterned simultaneously with the active layer 16, so as to be provided only under the active layer 16. The interface stabilizing layer 15 can be formed to a thickness of about 50 Å to 5,000 Å, so that the active layer 16 can be protected enough to maintain interface stability.

As described above, when the interface stabilizing layer 15 is disposed under the active layer 16, a physical deposition process is performed between the process of forming the gate insulating layer 14 and the process of forming the active layer 16. Therefore, in order to avoid redundancy, detailed description of a method of fabricating the TFT 10" and 10'" is omitted.

Although not shown, the interface stabilizing layer 15 can be disposed on the active layer 16. In this case, the interface stabilizing layer 15 can have a thickness of about 100 Å, or less, for example, a thickness of about 10 Å to 20 Å, to reduce the contact resistance between the source and drain electrodes 18 and the active layer 16. The interface stabilizing layer 15 can be formed to correspond to the etch stop layer 19. The interface stabilizing layer 15 can protect the active layer 16 and can be used as an etch stop layer when etching the source and drain electrodes 18. Therefore, an additional etch stop layer need not be provided.

Figure 6:
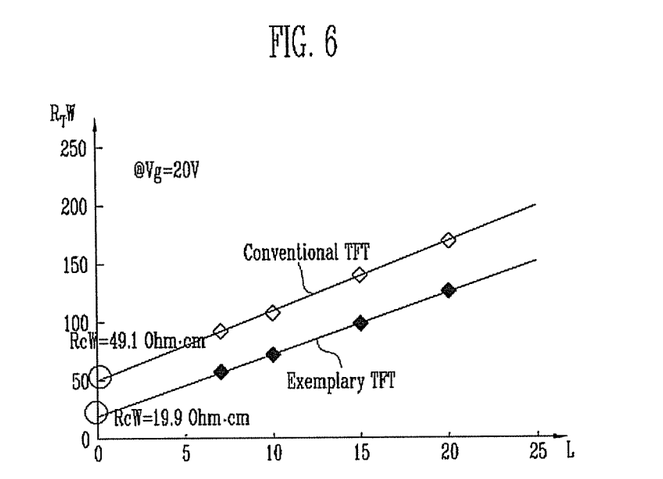
FIG. 6 is a graph illustrating the resistances $R_T$ of active layers according to length L, of a conventional TFT and an exemplary TFT.

FIG. 6 is a graph illustrating the total resistance $R_T$ of active layers, according to length L, of a conventional TFT and an exemplary TFT, according to aspects of the present invention. In FIG. 6, the conventional TFT line shows the total resistance $R_T$ of the active layer of the conventional TFT, where the active layer was formed to have a uniform thickness of d1. The exemplary TFT line shows the total resistance $R_T$ of the active layer of the exemplary TFT, where the thickness of contact regions of the active layer was reduced by 40%, in comparison with the thickness of the remaining region thereof. The $R_TW$ of the Y axis represents the product of the total resistance $R_T$ and the width W of the active layer (5 μm). The units of the X axis are [μm] and the units of the Y axis are [Ohm·cm].

Referring to FIG. 6, the total resistance of the active layer of the conventional TFT and the exemplary TFT increased linearly, in accordance with an increase in the length L. The contact resistance $R_C$ of the conventional TFT was less than the contact resistance Rc of the exemplary TFT. In the exemplary and conventional TFTs were the same, except for the thickness of the contact regions. The length L was the length of the contact regions between the source and drain electrodes, and the active material layer. The width W was the width of the active layer.

To be specific, the total resistance $R_T$ of the active layer was the sum of the channel resistance $R_{Ch}$ and the contact resistance $R_C$, as described in EQUATION 1. Since the channel resistance $R_{Ch}$ is proportional to the unit surface resistance $R_{Ch'}$ and the length L, and is inversely proportional to the width W, the total resistance $R_T$ of the active layer is illustrated in EQUATION 2.

$$R_T = (R_{Ch'}/W) \times L + R_C \quad \text{[EQUATION 2]}$$

In Equation 2, $R_{Ch}$ and $R_C$ are measured in Ohms, and $R_{Ch'}$ is measured in Ohm/sq. Therefore, through the graph, the $R_{Ch'}$ can be extracted from the slopes of the lines, and the $R_C$ can be extracted from the Y intercept. The exemplary TFT had a lower contact resistance $R_C$ than the conventional TFT.

Figure 7:
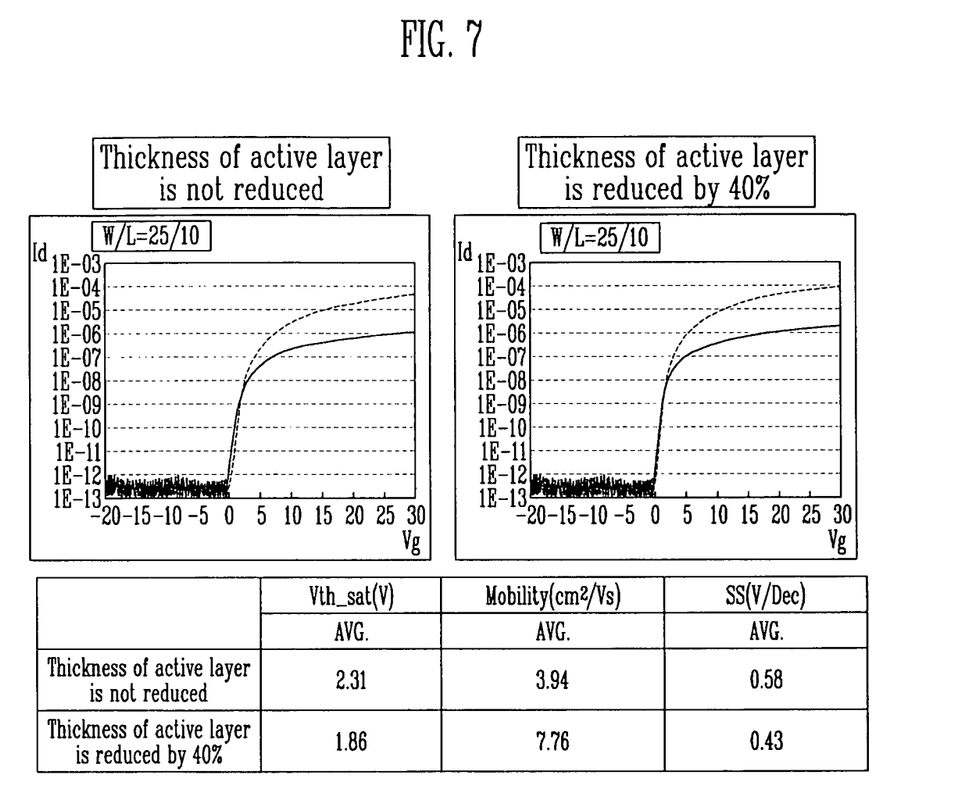
FIG. 7 is a graph illustrating drain currents Id according to gate voltages Vg, of the conventional TFT and the exemplary TFT.

FIG. 7 is a graph illustrating the drain currents Id of the conventional TFT and the exemplary TFT of FIG. 6. In FIG. 7, Vth represents a threshold voltage, Mobility represents carrier mobility, and SS represents a voltage required for increasing the drain current Id by one order. The dotted lines illustrate the values measured when a voltage (Vds) between a drain and a source was 5.1V. The solid lines illustrate the values measured when the voltage Vds was 0.1V. The X axis represents the gate voltage Vg in volts [V] and the Y axis represents the drain current Id in amps [A].

Referring to FIG. 7, in the exemplary TFT the drain current Id increased more rapidly in a sub-threshold region, as compared to the conventional TFT. In addition, a larger drain current Id flowed when the gate voltage Vg was 30V, as compared to the conventional TFT.

According to aspects of the present invention, it is noted that the characteristics of the TFTs improved, when the thickness of the active layer is reduced in contact regions. In particular, the mobility of the TFTs increases by almost two fold.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A thin film transistor (TFT) comprising:
    a gate electrode;
    an active layer overlapping the gate electrode, having contact regions that have a consistent thickness, and a remaining region that is thicker than the contact regions;
    an etch stop layer covering the remaining region and exposing the contact regions; and
    source and drain electrodes contacting the contact regions and directly contacting opposing surfaces of the remaining region.

2. The thin film transistor as claimed in claim 1, wherein the thickness of the contact regions is from about 10% to 90% of the thickness of the remaining region.

3. The thin film transistor as claimed in claim 1, wherein the active layer comprises an oxide semiconductor.

4. The thin film transistor as claimed in claim 3, wherein the active layer comprises an amorphous oxide having an electron carrier density of less than about $10^{18}/cm^3$.

5. The thin film transistor as claimed in claim 4, wherein the amorphous oxide comprises at least one selected from the group consisting of: an oxide comprising In, Zn, and Sn; an oxide comprising In, Zn, and Ga; or an oxide comprising at least one selected from the group consisting of Li, Na, Mn, Ni, Pd, Cu, Cd, C, N, P, Ti, Zr, Hf, V, Ru, Ge, Sn, and F.

6. The thin film transistor as claimed in claim 1, wherein the TFT has a bottom gate structure.

7. The thin film transistor as claimed in claim 6, wherein the source and drain electrodes directly contact the contact regions of the active layer.

8. The thin film transistor as claimed in claim 1, further comprising an interface stabilizing layer formed under the active layer, comprising an oxide having a band gap greater than, or equal to, the band gap of the active layer.

* * * * *